United States Patent
Lehner et al.

(10) Patent No.: US 6,895,731 B2
(45) Date of Patent: May 24, 2005

(54) APPARATUS FOR POPULATING TRANSPORT TAPES

(75) Inventors: Rudolf Lehner, Laaber (DE); Stefan Paulus, Zeitlarn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/739,488

(22) Filed: Dec. 18, 2003

(65) Prior Publication Data

US 2004/0079055 A1 Apr. 29, 2004

Related U.S. Application Data

(60) Division of application No. 10/358,953, filed on Feb. 4, 2003, which is a continuation-in-part of application No. PCT/DE01/02889, filed on Aug. 1, 2001, now Pat. No. 6,694,707.

(30) Foreign Application Priority Data

Aug. 4, 2000 (DE) .......................................... 100 38 163

(51) Int. Cl.$^7$ .............................................. B65B 47/04
(52) U.S. Cl. .............................. 53/559; 53/575; 53/578
(58) Field of Search ......................... 53/574, 220, 221, 53/222, 553, 558, 559, 579; 156/299, 300, 301; 264/271.1, 272.11

(56) References Cited

U.S. PATENT DOCUMENTS

| | | | |
|---|---|---|---|
| 2,896,387 A | * | 7/1959 | Brock ........................... 53/141 |
| 3,465,874 A | | 9/1969 | Hugle et al. |
| 3,920,371 A | * | 11/1975 | Faller .......................... 425/388 |
| 4,223,512 A | | 9/1980 | Buchner |
| 4,575,995 A | | 3/1986 | Tabuchi et al. |
| 4,702,788 A | | 10/1987 | Okui |
| 4,724,958 A | | 2/1988 | Kaneko et al. |
| 4,753,061 A | | 6/1988 | Braden et al. |
| 4,954,207 A | * | 9/1990 | Higuchi et al. .............. 156/552 |
| 5,136,827 A | | 8/1992 | Sawaya |
| 5,191,693 A | | 3/1993 | Umetsu |
| 5,443,546 A | * | 8/1995 | Bertalero ....................... 53/453 |
| 5,472,085 A | | 12/1995 | Gelzer |
| 5,802,821 A | * | 9/1998 | Albrecht ........................ 53/559 |
| 5,960,961 A | | 10/1999 | Gutentag |
| 6,003,676 A | | 12/1999 | Beyer |
| 6,216,419 B1 | * | 4/2001 | Sakurai ....................... 53/139.5 |
| 6,250,051 B1 | * | 6/2001 | Mori et al. .................... 53/453 |
| 6,513,306 B1 | * | 2/2003 | Milano ......................... 53/453 |
| 6,568,535 B1 | * | 5/2003 | Pylant ......................... 206/713 |

FOREIGN PATENT DOCUMENTS

| | | |
|---|---|---|
| DE | 36 26 765 A1 | 2/1988 |
| EP | 0 838 137 B1 | 4/1998 |
| GB | 850090 | 9/1960 |
| JP | 61094737 A | 5/1986 |
| JP | 11091711 A | 4/1999 |

* cited by examiner

Primary Examiner—Eugene Kim
Assistant Examiner—Paul Durand
(74) Attorney, Agent, or Firm—Laurence A. Greenberg; Werner H. Stemer; Ralph E. Locher

(57) ABSTRACT

An apparatus and a method for populating transport tapes with electronic components includes a mold support having at least one recess over which a flat plastic strip is disposed. A heater heats the mold support and/or the plastic strip in an area of the recesses. An embossing tool, which has the electronic component in its embossing area, together with the electronic component, is embossed into the plastic strip in the direction of the recess into the mold support to form a tape pocket.

20 Claims, 3 Drawing Sheets

APPARATUS FOR POPULATING TRANSPORT TAPES

CROSS-REFERENCE TO RELATED APPLICATION

This is a division of U.S. application No. 10/358,953, now U.S. Pat. No. 6,694,707 filed Feb. 4, 2003, which was a continuation of copending International Application No. PCT/DE01/02889, filed Aug. 1, 2001, which designated the United States and which was not published in English.

BACKGROUND OF THE INVENTION

Field of the Invention

The invention relates to an apparatus for populating transport tapes with electronic components.

Such transport tapes have preformed tape pockets, in which electronic components can be disposed and transported in an accurate position, and can be removed from the transport tapes in an accurate position. For the purpose of transport, the tape pockets of a transport tape are covered with the aid of a cover tape strip so that the electronic components cannot fall out of the tape pockets and their position in relation to the three spatial axes cannot change until they are removed from the transport tapes. During the introduction and positioning, in particular, of small and/or lightweight electronic components, such as are needed in great numbers for high-frequency engineering, lighting and laser engineering, and the like, rapid population with a high throughput rate is associated with the risk that the components will jump out of the tape pockets, and, therefore, considerably hamper the fitting operation of an automatic fitting machine for transport tapes, particularly, because, not only does the fitting have to be interrupted, but the automatic machine has to be thoroughly searched for the electronic components that have jumped out, and the fitting position of the automatic machine has to be redefined and readjusted.

A further problem in the population of transport tapes with small and/or lightweight electronic components in the millimeter range is to be seen in the fact that the precision requirements both on the shaping of the tape pockets and on the automatic fitting machine require continually increasing investment and development costs, in order to position the electronic components precisely and in an accurate position in the tape pockets and to meet these precision requirements.

SUMMARY OF THE INVENTION

It is accordingly an object of the invention to provide an apparatus for populating transport tapes that overcomes the hereinafore-mentioned disadvantages of the heretofore-known devices of this general type and that makes possible reliable and precise population of transport tapes with electronic components.

With the foregoing and other objects in view, there is provided, in accordance with the invention, an apparatus for populating transport tapes with electronic components, including a mold support having at least one recess for shaping tape pockets to hold the electronic components therein, a flat plastic strip disposed on the mold support covering the at least one recess, a heater for heating at least one of the mold support and the plastic strip, and an embossing tool having an embossing area for holding at least one of the electronic components therein, the embossing tool pressing the plastic strip into the at least one recess in the mold support with the electronic component positioned in the embossing area to mold the tape pocket with the electronic component.

According to the invention, the apparatus for populating transport tapes with electronic components includes a mold support having at least one recess for shaping tape pockets to hold electronic components in the tape pockets. Furthermore, the apparatus includes a plastic strip that, as a flat raw tape, is disposed on the mold support, covering the recess. A heater for heating the mold support and/or the plastic strip, and also an embossing tool are provided, the embossing tool having the electronic component in its embossing area, and it being possible for the tape pocket to be molded by the electronic component positioned in the embossing area as the electronic component presses the plastic strip into the recess in the mold support.

Using such a populating apparatus, the precision requirements on the automatic fitting machine are reduced considerably because the embossing tool for introducing tape pockets into a flat raw tape has the electronic component to be packaged in its embossing area, which means that the electronic component itself determines the closely tolerated dimensions of the tape pocket and shapes the tape pocket and, at the same time, the transport tape is populated with the electronic component in the tape pocket. This additionally means that the depositioning of the plastic strip on the mold support does not present any particularly high precision requirements. In addition, the recesses in the mold support have to correspond only roughly to the dimensions of the electronic component, it being possible to use one recess size for a number of tolerance classes of the electronic components, and, therefore, one mold support for a number of tolerance classes of electronic components.

In accordance with another feature of the invention, the embossing tool is a fitting element of an automatic fitting machine so that the automatic fitting machine continually supplies the embossing tool with electronic components in the embossing area and, in a manner similar to an automatic punching machine, the embossing tool molds the tape pockets with the aid of the electronic component in its embossing area and, at the same time, populates the pockets with the electronic component.

In accordance with a further feature of the invention, the embossing tool is an embossing punch, in whose embossing area the electronic component can be fixed by vacuum. This has the advantage that it becomes possible for the action of picking up the electronic component from the feed device that determines its position, the fixing of the component in the embossing area of the embossing tool, and the shaping of the tape pocket for the electronic component in the recess in the mold support to be carried out under vacuum. To populate the transport tape with the electronic component at the same time, it is merely necessary to cancel the vacuum fixing of the component in the embossing area of the embossing punch in order to position the electronic component in the self-molded tape pocket. For such a purpose, the embossing tool has a central evacuable bore, by which the component can be fixed in the embossing area when vacuum is applied to the central bore in the embossing tool.

In accordance with an added feature of the invention, the embossing tool is connected to a drive mechanism, by which, firstly, the embossing tool can be displaced in the Z direction toward the recess in the mold support and in the directions X and Y orthogonal thereto. Such an embodiment of the apparatus has the advantage that the embossing tool can be displaced in the directions X and Y orthogonal to the Z direction after the embossing tool has been lowered into the recess in the Z direction. The displacement in the X and Y directions can be carried out by excitation into ultrasonic oscillation, it becoming possible for the ultrasonic amplitude to be adjusted and, therefore, the requisite very close tolerance between the molded tape pocket and the dimensions of the electronic component to be produced. As a result of the creation of the tolerance, access by an automatic removal machine to the component positioned in the tape pocket is made easier and, secondly, the electronic component can be removed at the remover in an accurate position following population and transport. Furthermore, no transport tapes with prefabricated tape pockets and correspondingly close tolerances have to be prepared because the close tolerance is produced by the electronic component itself with the aid of the embossing tool and the movement in the X and Y directions.

In accordance with an additional feature of the invention, a recess in the mold support has, in its bottom area, an evacuable bore for shaping the tape pocket in the bottom area of the recess. With the aid of the evacuable bore, the bottom area of the tape pocket can be made to rest closely on the bottom area of the recess so that the depth of the tape pocket is determined by the depth of the recess in the mold support and, at the same time, the punch pressure on the embossing tool or the component that molds the tape pocket during population can be reduced. Furthermore, the risk of different tape pocket depths is reduced, which could possibly result when the punch tool is pressed into the recess with the plastic strip lying in between.

In accordance with yet another feature of the invention, the apparatus has a lifting apparatus for the body of the mold, which is used to lift the body of the mold in the direction of the embossing tool and lower it in the opposite direction. The advantage of such an embodiment is that the body of the mold can be constructed as a simple punch with a shaping die on its front side, the body of the mold being moved synchronously and cyclically in the Z direction toward the punch tool or away from it, in order to form a tape pocket in the flat raw tape or flat plastic strip while simultaneously populating the tape pocket with an electronic component.

In accordance with yet a further feature of the invention, the mold support has a cylindrical shape and, on its cylinder jacket, has at least one recess disposed for shaping tape pockets. Such a cylindrical mold support has the advantage that it can be rotated about its cylinder axis so that, after the tape pocket has been molded in the at least one recess on the cylinder jacket and the transport tape has been populated, and, after the punch tool has been pulled off the electronic component, the populated transport tape can be separated from the mold support by rotating the cylindrical mold support. In addition, pips can be provided in the marginal area of the cylinder jacket, which engage in a corresponding perforation in the plastic tape and, therefore, ensure an exact association between the distances between the populating positions on the transport tape. If only one shaping recess is provided on the cylinder jacket, then the next populating position is given after one revolution of the cylinder jacket around the cylinder axis. To reduce the distance between populating positions on the transport tape, a plurality of recesses can be provided on the cylinder jacket so that an increased throughput with a simultaneously reduced distance between the populating positions becomes possible. Furthermore, a plurality of positions for recesses can be provided one beside another on an envelope line of the cylinder to increase the holding capacity of the transport tape.

Instead of a cylindrical shape for the mold support with a circular cross-section of the mold support, a polygonal cross-section can also be provided. Therefore, in accordance with yet an added feature of the invention, the mold support has a polygonal columnar shape and, on its polygonal edge faces, in each case has one recess disposed for shaping tape pockets. Such a polygonal columnar shape of the mold support has the advantage that, after the tape pocket has been shaped, as the mold support is rotated about its axis of rotation, the edges on the outer surface of the polygonal columnar shape lift the tape pockets that have been produced and populated out of the recess on the polygonal edge face, and, therefore, make it easier for the mold support to be separated from the populated transport tape.

With the aid of a suitable drive, a cylindrical or polygonal mold support of this type, by being rotated about its axis of rotation in a cyclic manner, can rotate a populating position into the embossing area of the embossing tool and out of the embossing area of the embossing tool while, at the same time, the embossing tool itself can carry out a punching movement in the Z direction or in the direction of the recess and out of the recess.

Recesses of different size can also be provided on a cylindrical or polygonal mold support, and can be rotated into a populating position depending on the size required, it being possible for a mold support so configured to be separated from the populated transport tape by a corresponding lifting movement of the body of the mold.

In accordance with yet an additional feature of the invention, the plastic strip is a polystyrene film or a polycarbonate film that, for the cyclic onward transport into the populating position and out of the populating position, can be provided with a perforation in the marginal area of the plastic strip.

In accordance with again another feature of the invention, the plastic strip has a graphite or carbon filler. This graphite or carbon filler improves the electrical surface conductivity of the plastic strip so that electrostatic charges are avoided during the shaping of the tape pocket, in particular, during the movement of the embossing region of the embossing tool with the electronic component orthogonally with respect to the embossing direction of the electronic component, in spite of relative movement between plastic strip and bottom area of the electronic component.

In accordance with again a further feature of the invention, the latter has a feed device for a cover tape strip for covering the tape pockets. The feed device substantially includes a deflection roller, which deflects the cover tape strip from an unwind direction into a covering direction to cover the populated transport tape, in particular, in the region of its tape pockets. To join the cover tape strip with the populated transport tape, the apparatus can have or be a plastic welding device or an adhesive bonding device, in order to weld or stick the cover tape strip on in the area of the tape pockets on the transport tape strip.

In accordance with again an added feature of the invention, the apparatus additionally has a rotational body, on which the populated transport tape with the cover tape strip can be wound up so that the electronic components remain securely disposed in the tape pockets following the population, during transport, and during the removal in an accurate position, for example, by an automatic fitting machine for printed circuit boards, at the remover.

With the objects of the invention in view, there is also provided an apparatus for populating at least one transport tape with electronic components, including a transport tape formed as a flat plastic strip, a mold support having at least one recess for shaping tape pockets in the plastic strip to hold respective ones of the electronic components therein, the plastic strip disposed on the mold support covering the at least one recess, a heater for heating at least one of the mold support and the plastic strip, and an embossing tool having an embossing area for holding at least one of the electronic components therein, the embossing tool pressing the plastic strip into the at least one recess in the mold support with the electronic component positioned in the embossing area to mold the tape pocket with the electronic component.

With the objects of the invention in view, there is also provided a method for populating transport tapes with electronic components having the steps of providing a mold support with at least one recess for tape pockets to hold electronic components, positioning a deformable flat plastic strip on the mold support in the area of the recess, heating the mold support and/or the plastic strip, picking up an electronic component by an embossing tool and disposing the electronic component in the embossing area of the embossing tool, pressing the embossing area of the embossing tool into the recess in the mold support while forming a tape pocket in the plastic strip disposed on the recess, and removing the embossing tool from the tape pocket while leaving the electronic component in the tape pocket. Preferably, the positioning, heating, picking up, pressing, and removing steps are repeated to populate a plurality of tape pockets with a respective plurality of the electronic components.

Such a method has the advantage that, with the shaping of the tape pockets in a flat raw tape, at the same time the electronic component determines the internal dimensions of the tape pocket so that closely tolerated tape pockets can be implemented without precision requirements on the mold support, the punch tool, and the guidance of the flat plastic strip to be deformed.

In accordance with again an additional mode of the invention, the embossing tool is moved in the directions orthogonal to the pressing direction as it is pressed into the recess. In such a case, the magnitude of the movement determines the loose fit of the electronic component in the tape pocket so that trouble-free removal of the component from the tape pocket following transport in an accurate position is made possible, without the electronic component being able to rotate about one of the three spatial axes, namely, the vertical axis, the longitudinal axis, and the transverse axis, in the tape pocket. This loose fit may, thus, be matched closely to the dimensions of the electronic component, for which reason, for example, the embossing tool can be deflected by an ultrasonic generator in the directions orthogonal to the embossing direction, the close tolerance between the internal dimensions of the tape pockets and the external dimensions of the electronic component being determined by the amplitude of the ultrasound.

In accordance with still another mode of the invention, the embossing tool and the mold support are moved apart after the tape pocket has been molded, the latter being populated with an electronic component at the same time, and the transport tape produced and populated with an electronic component in the tape pocket is moved out of the populating position, while the flat plastic strip assumes the next populating position.

In such an implementation of the method, for the purpose of population and for the purpose of assuming the next populating position, only lifting movements of the mold support and of the punch tool are carried out cyclically, which simplifies the requirement on the precision of the method to a great extent, particularly because the recess in the mold support does not have to be matched precisely to the dimensions of the component and the tape pocket, because, ultimately, the electronic component itself determines the internal dimensions of the tape pocket as the embossing tool and mold support with recesses are moved together.

In accordance with still a further mode of the invention, after the molding and the simultaneous population of a tape pocket with an electronic component, the embossing tool can accommodate the next electronic component in its embossing area. For such a purpose, a feed device can move the next component into the engagement area of the embossing tool, when the embossing tool and mold support are moved apart, in order to accommodate an electronic component in the embossing area of the embossing tool so that it is ensured that the electronic component is accommodated in an accurate position in the embossing area of the embossing tool.

To make the molding of a tape pocket with the aid of an electronic component easier, either the plastic strip and/or the mold support is/are heated in the area of the tape pocket to be formed so that in a further implementation of the method, after molding, with the simultaneous population of a tape pocket, the heated transport tape is actively cooled. Such active cooling can be carried out with the aid of an air stream after the mold support and transport tape have been separated.

In accordance with still an added mode of the invention, the populated tape pocket can be guided over a water-cooled surface for the purpose of cooling. Both methods advantageously mean that the molded tape pocket is stabilized in its shape such that, for example, the populated transport tape can be wound onto a rotational body without any subsequent deformation of the tape pockets.

The heating of the mold support, possibly necessary for the molding of tape pockets, can be carried out by a current flow through a resistance heater. Such a resistance heater is, preferably, disposed inside the mold support in the vicinity of the recess so that the flat plastic strip is heated only in the area of the tape pocket to be molded and populated.

In accordance with still an additional mode of the invention, the heating of the mold support and/or of the plastic strip is produced by a current flow through Peltier elements, it being possible for the cooling side of the Peltier elements to be used at the same time to provide a cooled surface for contact with the populated tape pockets. Such a technique has the advantage that a considerable temperature difference between a surface to be heated and a side to be cooled by a current flow becomes possible in a relatively small space, it being possible for the Peltier elements to be incorporated either directly in the mold support or in the support for the surface to be cooled.

While heating by resistance heaters or Peltier elements can, preferably, be carried out in the body of the mold, the heating of the plastic strip is carried out in another implementation of the method by radiant heat from a heat source. In one implementation of the method, the heat source can supply infrared rays. This type of radiation has, in particular, a considerable advantage if the plastic strip is provided with a graphite or carbon filler that, furthermore, is intended to prevent electrostatic charging of the plastic strip at its surface. The graphite or carbon filler absorbs infrared rays with high efficiency and, therefore, heats up the plastic strip.

Infrared irradiation also has the advantage that the plastic strip can be heated exactly in the area in which the next tape pocket is to be molded because the area of action of the infrared rays can be delimited by suitable optical aperture stops. Because the surrounding material of the plastic strip remains virtually at room temperature, the plastic strip is not changed and is dimensionally accurately maintained in the marginal area, in which a perforation can also be provided.

Following the molding and population of the tape pockets, in accordance with another mode of the invention, a cover tape strip covers the populated transport tape, at least in the area of the populated tape pockets. Such covering can, additionally, be secured by welding the cover tape strip to the transport tape or by adhesively bonding the same to each other.

In accordance with a further mode of the invention, as the tape pocket is molded, the bottom area of the tape pocket is molded by evacuating the interspace between the bottom of the tape pocket and the bottom of the recess. This has the advantage that the bottom area of the tape pocket rests closely on the bottom of the recess, and, therefore, the depth of the tape pocket is determined by the depth of the recess and no deviations can occur in the depth when the embossing tool is pressed simply into the recesses in the mold support.

In accordance with an added mode of the invention, a central s bore in the mold support, provided to evacuate the interspace between the bottom of the tape pocket and the bottom of the recess, can be used to separate the bottom area of the tape pocket from the bottom area of the recess after the tape pocket has been populated with an electronic component, by pressing a gaseous medium in between the bottom area of the tape pocket and the bottom area of the recess. This, therefore, results in the advantage of reliable molding and demolding of the bottom area of the tape pocket, and reliable separation between tape pocket and mold support, without the component jumping out of the tape pocket during this procedure, particularly because, in this phase of the method, the embossing tool can hold the component in position and is separated from the electronic component in its embossing area only after the mold support has been removed. To separate embossing tool and electronic component, the electronic component can be held in the tape pocket while a gaseous medium is introduced through a central bore in the embossing tool as the embossing tool is lifted off the electronic component.

The separation of mold support and tape pocket or mold support and populated transport tape can be carried out substantially in two ways. In one implementation of the method, the mold support is lowered with respect to the populated transport tape and, in another implementation of the method, the populated tape pocket is separated from the mold support by rotating the mold support about an axis of rotation, with simultaneous horizontal displacement of the transport tape. Both types of implementation ensure that the populated transport tape maintains its horizontal position until it is covered with a cover tape strip.

In accordance with an additional mode of the invention, the transport tape is wound onto a rotational body together with a cover tape strip.

As soon as a cover tape strip closes the tape pockets, the transport tape can assume any desired position in space without the electronic component falling out or being rotated about one of the spatial axes in the tape pocket so that the electronic component can be transported in an accurate position as far as the remover. If the transport tape strip and cover tape strip are wound up jointly on a rotational body, this simultaneously provides the assurance that a minimum area of storage space and a minimum area of transport space are needed for the populated transport tape.

The population of a transport tape is also referred to as taping, transport tapes that merely include a plastic film with tape pockets also being known as blister tapes. "Blister taping" in the case of small or lightweight components needs a very closely tolerated blister tape to prevent the components from springing out of the tape at high revolutions per hour. At the same time, this results in the requirement on the blister tape that a tape system or else an automatic fitting machine has to deposit the components in the tape with high precision, which, in turn, could reduce the revolutions per hour value. Therefore, in the solution according to the invention, the tape system is supplied with a flat raw tape, in which small bowls or else tape pockets are deep drawn under temperature and pressure with the aid of the components. The blister tape can, therefore, be adapted optimally for the respective component, and the tolerances that have to be complied with by the tape system can be minimized. The cycle times of the tape system and the pick-and-place system at the customer, which is used to remove the components from the transport tape, are, in principle, not affected disadvantageously. At the same time, however, the costs for a blister tape can be reduced because only a flat raw tape has to be supplied to the system. This flat blister tape can be placed over a setting die or mold support and the component with the blister tape can be introduced into the setting die. The introduction can be carried out with vacuum assistance and a certain pressing force through the component. In certain circumstances, the component additionally has to be moved in the X and Y directions in this die so that the component is not jammed in the tape and can, therefore, be removed easily, again, at the customer.

Other features that are considered as characteristic for the invention are set forth in the appended claims.

Although the invention is illustrated and described herein as embodied in an apparatus for populating transport tapes, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
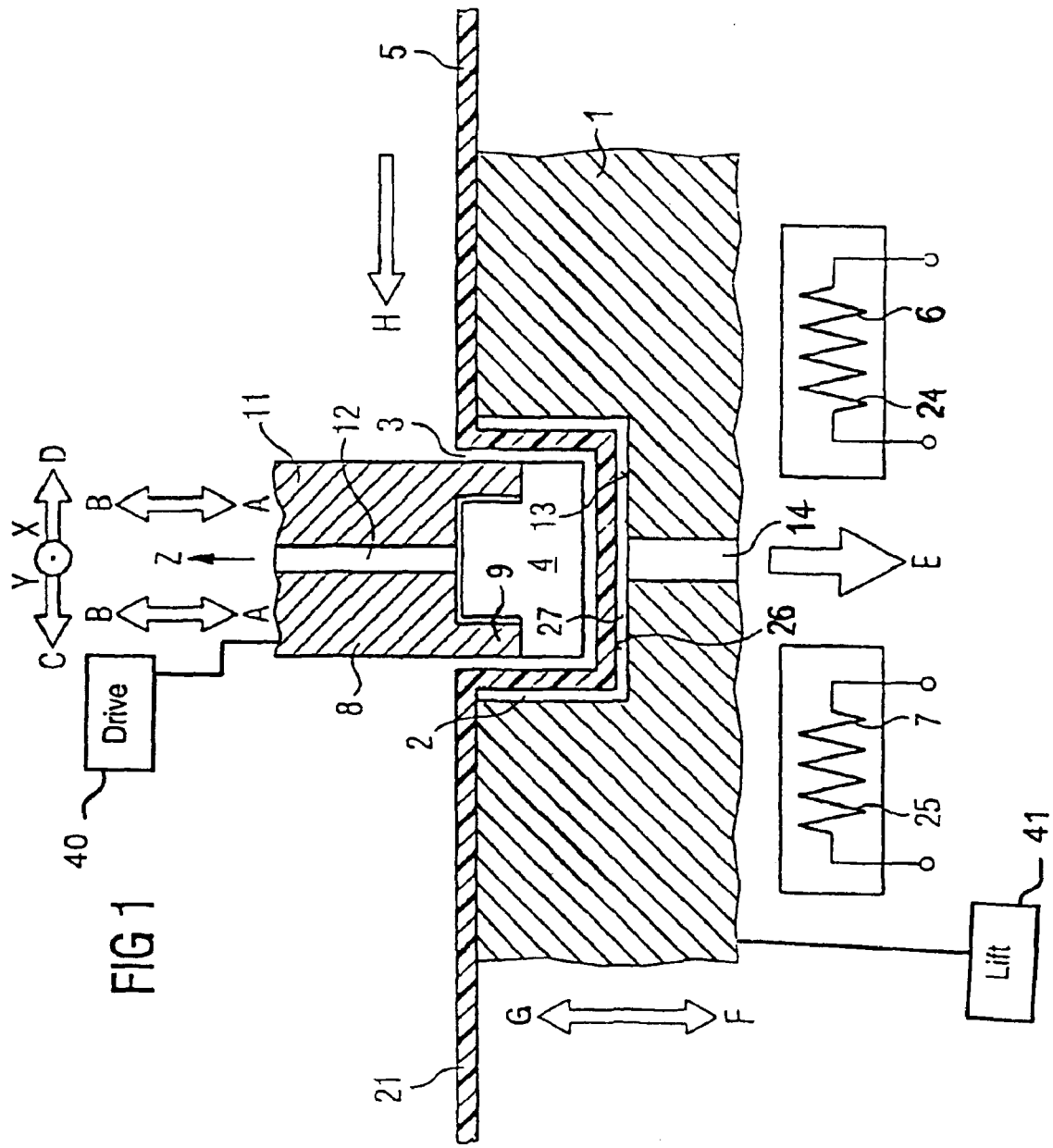
FIG. 1 is a fragmentary, cross-sectional view through one embodiment according to the invention.

Referring now to the figures of the drawings in detail and first, particularly to FIG. 1 thereof, there is shown a basic cross-section through one embodiment of the invention.

This embodiment is used to populate transport tapes 21 with electronic components 4. For such a purpose, a mold support 1 has a recess 2 for shaping tape pockets 3. A plastic tape or strip 5 is disposed flat on the mold support 1 and is molded to form a tape pocket 3 in the area of the recess 2 in the mold support.

To mold the tape pocket 3, an embossing tool 8, which bears an electronic component 4 in its embossing area 9, projects into the tape pocket 3 so that the dimensions of the tape pocket 3 can be matched with close tolerances to the electronic components 4. Through a central bore 14 in the mold support 1, at least in the bottom area of the recess, the interspace between mold support 1 and plastic strip 5 can be minimized so that the depth of the tape pocket 3 is determined by the depth of the recess. The tape pocket 3 has a bottom area 26. For such a purpose, the air is pumped away out of the interspace 27 in the direction of arrow E. Electric resistance heaters 6, 7 are disposed in the mold support 1 in the vicinity of the recess 2 to heat the mold support 1 and to make it easier to mold a tape pocket 3 into the plastic strip 5.

The plastic strip 5 in this embodiment is made of a polycarbonate or a polystyrene material, which is blackened with a graphite filler, which reduces the surface resistance of the plastic strip 5 to such an extent that no electrostatic charging arising from frictional movements between electronic component 4 and plastic tape pocket 3 during the formation of the tape pocket can endanger the electronic component 4. In this embodiment, the embossing tool 8 is constructed as an embossing punch 11 having a central evacuable bore 12. The bore 12 is evacuated to pick up the electronic component in an accurate position in the embossing area 9 of the embossing punch 11 and, consequently, acts like vacuum forceps.

After the tape pocket 3 has been embossed into the flat plastic strip 5, the vacuum forceps can be switched over from vacuum to an air stream so that the electronic component 4 is separated from the embossing punch 11. The embossing punch 11 can, thus, be pulled off in the direction of arrow B (through a drive mechanism diagrammatically illustrated by box 40), leaving the electronic component 4 in the tape pocket 3. The mold support 1 can also be pulled off the populated transport tape 21 in the direction of arrow F, it being possible for the separation of the mold support 1 from the plastic strip 5 to be assisted by blowing a gaseous medium in through the bore 14 in the mold support 1.

After the mold support 1 has been pulled off the populated transport tape 21, the tape 21 can be transported away in the horizontal direction H with the electronic component 4 positioned in the tape pocket 3, while the flat plastic strip 5 assumes the next populating position, in which the next component that is picked up by the embossing tool 8 is deposited in a tape pocket 3 to be molded in the plastic strip 5. To such an end, the embossing tool 8 is, again, lowered in the direction of arrow A and, possibly at the same time, the interspace 27 between the plastic strip 5 and the recess 2 in the mold support 1 is minimized by applying a vacuum to the evacuable bore 14.

As the electronic component 4 is pressed into the recess 2 in the mold support 1, the embossing tool 8 can vibrate simultaneously in the directions of arrows C and D so that a closely toleranced loose fit between electronic component 4 and inner side of the tape pocket 3 is produced. This loose fit ensures firstly that the electronic component can move but is limited in its movement such that it cannot rotate about any of the three spatial axes (vertical axis, longitudinal axis, transverse axis), so that the electronic component 4 can s be packed in an accurate position in the adapted tape pocket 3, can be transported and removed from the transport tape 21 again.

Figure 2:
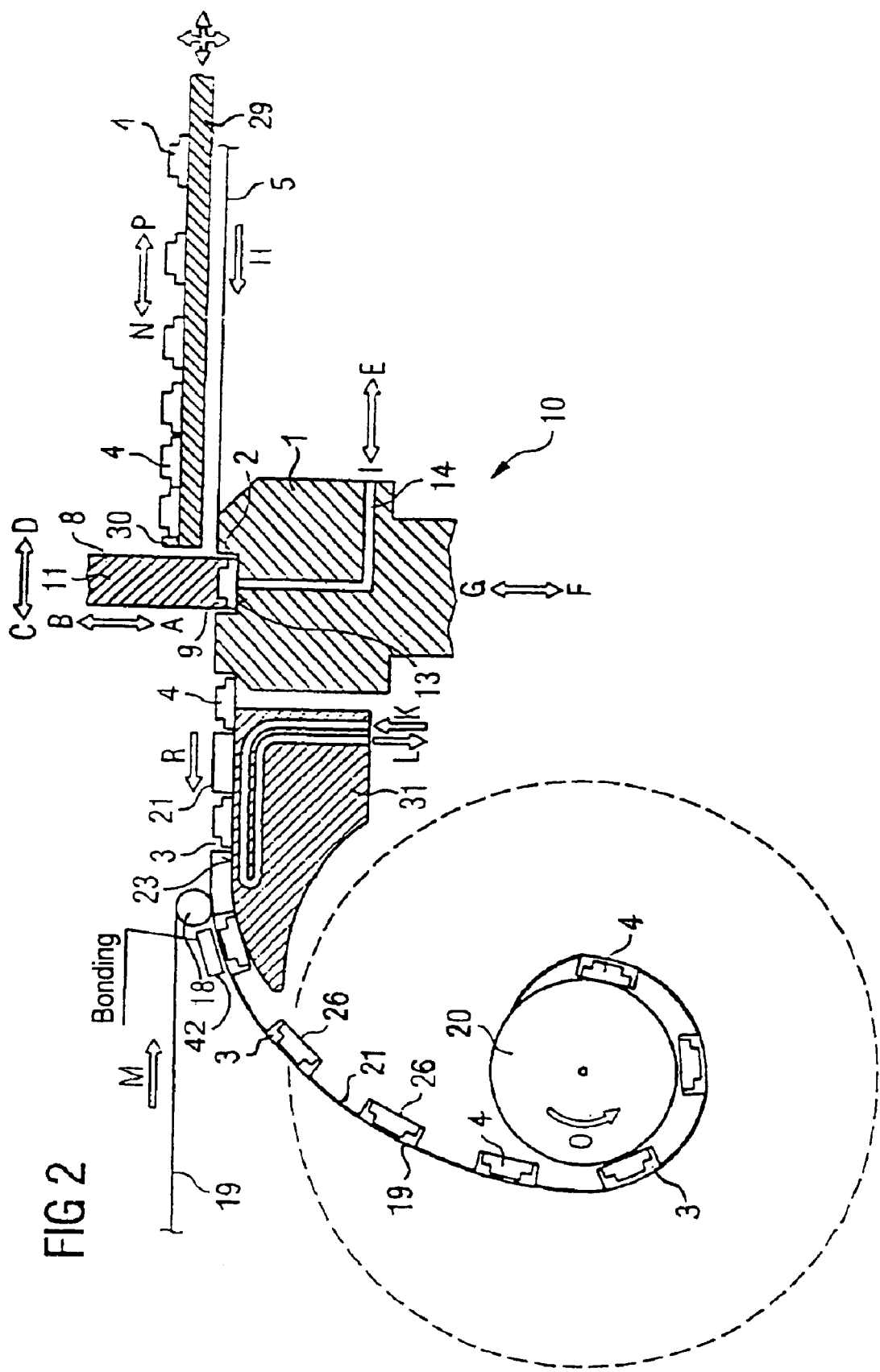
FIG. 2 is a fragmentary, cross-sectional view through an automatic fitting machine of a further embodiment according to the invention.

FIG. 2 shows a basic sketch of an automatic fitting machine 10 from a further embodiment of the invention. The reference symbols are maintained in FIG. 2 if they designate the same components as in FIG. 1. Reference symbol 29 designates a vibrating channel, through which electronic components 4 are transported in the direction N as far as a stop 30. Reference symbol 23 identifies a cooled surface, on which the tape pockets 3 populated with electronic components 4 are cooled. The surface 23 can be cooled by a cooling liquid, which is introduced into the cooling element 31, into a cooling duct system, in the direction K and leaves the cooling element 31 in the direction L.

In addition, the automatic fitting machine 10 of FIG. 2 shows a cover tape strip 19, which is supplied to the transport tape 21 in the direction of arrow M over a deflection roller 18 and covers the tape pockets 3 of the transport tape 21, the transport tape 21 with the cover tape strip 19 disposed on it being wound up onto a rotational body 20 in the direction of arrow O for space-saving storage and for space-saving transport. The apparatus can have a plastic welding device or an adhesive bonding device 42 to weld or stick the cover tape strip 19 on in the area of the tape pockets 3 on the transport tape strip 21.

The central apparatus of the automatic fitting machine 10 for populating a transport tape 21 with electronic components 4 corresponds to FIG. 1, an embossing tool 8 with an electronic component 4 disposed in its embossing area 9 embossing a tape pocket 3 into the plastic strip 5, simultaneously configuring the electronic component 4 in the tape pocket 3. To mold the tape pocket 3, a recess is provided in a mold support, which can be moved in the directions of arrows G and F by a lifting plunger or device 41. In detail, the following method steps are carried out by the apparatus according to FIG. 2.

The embossing tool 8 is raised in the direction of arrow B above the level of the vibrating channel 29. The vibrating channel 29 is moved forward in the direction N so that the embossing tool 8 can be lowered in the direction of arrow A onto an electronic component 4 at the stop 30 of the vibrating channel 29. By applying a vacuum to a central bore of the embossing tool 8, shown in FIG. 1, the electronic component 4 is disposed in the embossing area 9 of the embossing tool 8.

The vibrating channel 29 is, then, pulled out of the embossing area 9 of the embossing tool 8 in the direction of arrow P and the embossing tool 8 is lowered onto the plastic strip 5, which rests flat on the mold support 1. During this lowering, firstly, the electronic component 4 is fixed by vacuum in the embossing area 9 of the embossing tool 8 and, secondly, a vacuum is applied to the bore 14 in the mold support 1. By additional movement of the embossing tool 8 in the directions of arrows C and D, a tape pocket 3 is molded in the recess 2, which ensures a loose but closely tolerated fit for the electronic component 4 in the tape pocket 3.

After the tape pocket 3 has been molded, first, an air stream is let into the bore 14 in the direction of arrow I, and the mold support 1 is separated from the populated transport tape 21 and pulled away downward in the direction of arrow F. Then, by switching off the vacuum from the central bore in the embossing tool 8 or by changing over to a gas stream, the electronic component 4 is separated from the embossing tool 8 so that the electronic component 4 remains with a loose fit in the tape pocket 3 in the transport tape 21. The tape pocket 3 is, then displaced horizontally by one position in the direction of arrow R, and the still heated tape pocket 3 is cooled on the cooled surface 23, while the recess 2 of the mold support 1 is covered, again, by the flat plastic strip 5.

To emboss the next component into the plastic strip 5, a further electronic component 4 is accommodated by the embossing tool 8 in the embossing area 9. This cyclic procedure of populating the transport tape 21 can be continued at high speed, without excessively high requirements having to be placed on the precision of the embossing tools, the recesses or the mold support, particularly because the shape of the electronic component 4 determines the size of the tape pockets 3. Because the cooled tape pockets are substantially stiffer than the intermediate sections of the populated transport tape 21, it is possible, after the tape pockets 3 have been covered by the cover tape strip 19 in the direction of arrow M, to transport and to store the transport tape 21 in any desired position. In the case of the embodiment of FIG. 2, the transport tape 21 together with the cover tape strip 19 is wound up onto a rotational body 20.

The advantage of such an automatic fitting system, corresponding to FIG. 2, is that secure and reliable population of a transport tape 21 in an accurate position is possible with extremely short cycle times.

Figure 3:
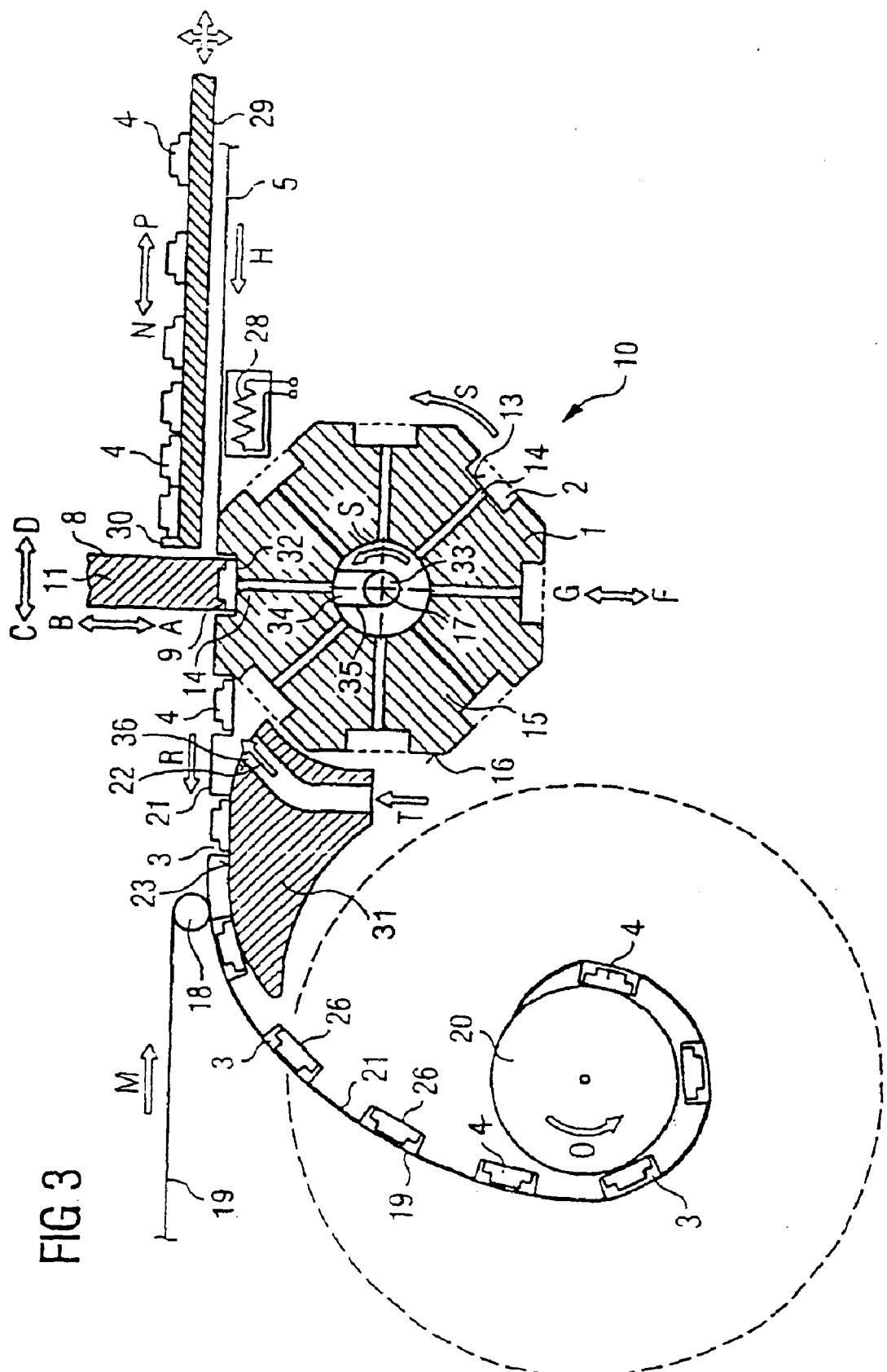
FIG. 3 is a fragmentary, cross-sectional view through an automatic fitting machine of a third embodiment according to the invention.

FIG. 3 shows a basic sketch of an automatic fitting machine 10 of a third embodiment of the invention. Identical components in FIG. 3 are designated by the same reference symbols as in FIGS. 1 and 2. As distinct from the embodiment of FIG. 1 and FIG. 2, the mold support 1 is not connected to a lifting plunger but is constructed as a polygonal column 15, the edge surfaces of the polygonal column 15 bearing recesses 2. These recesses 2 can have identical dimensions and, as a result of rotation in the direction of arrow S of the mold support 1 about its axis of rotation 17, can be rotated one after another into the populating position 32. For such a purpose, the embossing tool 8 must previously have been raised in the direction of arrow B.

As a result of the rotation of the mold support 1 about its axis of rotation 17, the populated transport tape 21 is raised at the polygonal corners so that the tape pocket 3 with electronic component is lifted out of the mold support 1. At the same time, an air stream can assist this procedure through the central bore 14. During the embossing operation, the central bore 14 is supplied with vacuum through the axial bore 33 and the radial bore 34 in the shaft 35 to match the bottom area of the tape pocket 3 closely to the bottom area of the recess 2 in the mold support 1.

As distinct from the first embodiment of FIG. 1, in the third embodiment of FIG. 3, the mold support 1 is not heated, instead, the plastic strip 5 is preheated locally, through the heater 28 for the plastic strip 5, at the point where a tape pocket 3 is to be formed in the next position. Although a resistance heater is provided as the heater 28 in the embodiment of FIG. 3, infrared radiation is also advantageously used at this point, in order, by aperture stops, to limit the heated area of the plastic strip 5 to the area needed for the next tape pocket.

Instead of the water-cooled cooling element shown in FIG. 2, in the embodiment of FIG. 3, a cooling element 31 is provided, which cools the populated tape pockets 3 through an air stream 22. To perform the cooling, a gaseous cooling medium is supplied to a cooling nozzle 36 in the direction of arrow T.

Alternatively, the polygonal mold support 1 can carry out a lifting movement in the directions of arrows F and G in addition to the rotational movement in the direction of arrow so that the polygonal edge surfaces 16 of the polygonal columnar shape 15 can be equipped with recesses 2 of different size. The rotational movement S about the axis of rotation 17 is, then, used to set the recesses in accordance with the different component sizes. This alternative embodiment has the advantage that it is possible to change relatively quickly between different component sizes because, in each case, the appropriate recess is to be brought into the populating position by a simple rotational movement.

We claim:

1. An apparatus for populating transport tapes with electronic components, comprising:
    a mold support having at least one recess for shaping tape pockets to hold the electronic components therein;
    a flat plastic strip disposed on said mold support covering said at least one recess;
    a heater for heating at least one of said mold support and said plastic strip; and
    an embossing punch having an embossing area for holding at least one of the electronic components therein, said embossing punch pressing said plastic strip into said at least one recess in said mold support with the electronic component positioned in said embossing area to mold said tape pocket with the electronic component; and
    a vacuum removably fixing the electronic component in said embossing area.

2. The apparatus according to claim 1, wherein said embossing tool is a fitting element of an automatic fitting machine.

3. The apparatus according to claim 1, wherein said embossing tool has a central evacuable bore by which the electronic component is removably fixed in said embossing area.

4. The apparatus according to claim 1, including a drive mechanism connected to said embossing tool, said drive mechanism displacing said embossing tool in a direction of said at least one recess in said mold support and in directions orthogonal thereto.

5. The apparatus according to claim 1, wherein said at least one recess in said mold support has:
    a bottom area; and
    an evacuable bore disposed in said bottom area for shaping said tape pocket in said bottom area.

6. The apparatus according to claim 1, wherein:
    said mold support is cylindrical with a cylinder jacket; and
    said at least one recess for shaping tape pockets is disposed on said cylinder jacket.

7. The apparatus according to claim 1, wherein:
    said mold support has a polygonal columnar shape with polygonal edge surfaces;
    said at least one recess is a plurality of recesses; and
    at least one recess for shaping tape pockets is respectively disposed on said polygonal edge surfaces.

8. The apparatus according to claim 1, wherein said mold support has an axis of rotation about which said mold support rotates said at least one recess into and out of said embossing area of said embossing tool.

9. The apparatus according to claim 1, wherein said mold support has a lifting device lifting said mold support in a direction of said embossing tool and lowering said mold support in a direction opposite thereof.

10. The apparatus according to claim 1, wherein said plastic strip is a polystyrene film.

11. The apparatus according to claim 1, wherein said plastic strip is a polycarbonate film.

12. The apparatus according to claim 1, wherein said plastic strip has one of a graphite filler and a carbon filler.

13. The apparatus according to claim 1, including:
  a cover tape strip; and
  a feed device supplying said cover tape strip to cover said tape pockets.

14. The apparatus according to claim 13, including a plastic welding device welding said cover tape strip on said tape pockets and closing said tape pockets.

15. The apparatus according to claim 1, including a rotational body winding up said plastic strip with the electronic components disposed in said tape pockets.

16. The apparatus according to claim 1, wherein:
  said plastic strip is a transport tape; and
  a rotational body winds up said transport tape with the electronic components disposed in said tape pockets.

17. An apparatus for populating at least one transport tape with electronic components, comprising:
  a transport tape formed as a flat plastic strip;
  a mold support having at least one recess for shaping tape pockets in said plastic strip to hold respective ones of the electronic components therein, said plastic strip disposed on said mold support covering said at least one recess;
  a heater for heating at least one of said mold support and said plastic strip;
  an embossing punch having an embossing area for holding at least one of the electronic components therein, said embossing punch pressing said plastic strip into said at least one recess in said mold support with the electronic component positioned in said embossing area to mold said tape pocket with the electronic component; and a vacuum removably fixing the electronic component in said embossing area.

18. An apparatus for populating transport tapes with electronic components, comprising:
  a mold support having at least one recess for shaping tape pockets to hold the electronic components therein;
  a flat plastic strip disposed on said mold support covering said at least one recess;
  a heater for heating at least one of said mold support and said plastic strip;
  an embossing punch having an embossing area for holding at least one of the electronic components therein, said embossing punch having the electronic component positioned in said embossing area when pressing the electronic component into said plastic strip and into said at least one recess in said mold support to mold a tape pocket in said plastic strip with the electronic component; and
  a vacuum removably fixing the electronic component in said embossing area.

19. An apparatus for populating transport tapes with electronic components, comprising:
  a mold support having at least one recess for shaping tape pockets to hold the electronic components therein;
  a flat plastic strip disposed on said mold support covering said at least one recess;
  a heater for heating at least one of said mold support and said plastic strip; and
  an embossing tool having a central evacuable bore by which the electronic component is removably fixed in said embossing area and an embossing area for holding at least one of the electronic components therein, said embossing tool pressing said plastic strip into said at least one recess in said mold support with the electronic component positioned in said embossing area to mold said tape pocket with the electronic component.

20. An apparatus for populating transport tapes with electronic components, comprising:
  a mold support having at least one recess for shaping tape pockets to hold the electronic components therein:
  a flat plastic strip disposed on said mold support covering said at least one recess;
  a heater for heating at least one of said mold support and said plastic strip;
  an embossing tool having an embossing area for holding at least one of the electronic components therein, said embossing tool pressing said plastic strip into said at least one recess in said mold support with the electronic component positioned in said embossing area to mold said tape pocket with the electronic component; and
  a drive mechanism connected to said embossing tool, said drive mechanism displacing said embossing tool in a direction of said at least one recess in said mold support and in directions orthogonal thereto.

* * * * *

UNITED STATES PATENT AND TRADEMARK OFFICE
CERTIFICATE OF CORRECTION

PATENT NO. : 6,895,731 B2
DATED : May 24, 2005
INVENTOR(S) : Rudolf Lehner et al.

It is certified that error appears in the above-identified patent and that said Letters Patent is hereby corrected as shown below:

Column 7,
Line 27, should read -- central bore in the mold support, provided to evacuate the --.

Signed and Sealed this

Twenty-seventh Day of September, 2005

JON W. DUDAS
*Director of the United States Patent and Trademark Office*